United States Patent

Chu et al.

[15] 3,649,268

[45] Mar. 14, 1972

[54] PROCESS FOR FORMING IMAGES BY PHOTOHARDENING AND APPLYING A COLORANT

[72] Inventors: Victor F. H. Chu, Chalfonte, Wilmington, Del.; Abraham B. Cohen, Springfield, N.J.

[73] Assignee: E. I. du Pont de Nemours and Company, Wilmington, Del.

[22] Filed: Feb. 5, 1969

[21] Appl. No.: 796,890

[52] U.S. Cl. ....................96/27 R, 96/33, 96/36.2, 96/40, 96/115 P

[51] Int. Cl. ....................G03c 5/04

[58] Field of Search ....................96/27, 28, 115 P

[56] References Cited

UNITED STATES PATENTS

| | | | |
|---|---|---|---|
| 3,060,026 | 10/1962 | Heiart | 96/27 R |
| 3,192,194 | 6/1965 | Burg | 96/115 P |
| 3,481,736 | 12/1969 | Ruff | 96/28 |

*Primary Examiner*—Norman G. Torchin
*Assistant Examiner*—John Winkelman
*Attorney*—James T. Corie

[57] ABSTRACT

An image reproduction process in which an element having a removable support and a photohardenable layer is (1) laminated to a suitable receptor, (2) imagewise exposed through the support to actinic radiation which selectively raises the stick temperature of those areas receiving the radiation, (3) the support stripped from the layer, and (4) the outer surface of the layer treated (e.g., dusted) with material which adheres only to the underexposed areas of the layer to read-out the image. By repeating the laminating, exposing with separate color separation records, stripping and treating steps in sequence, a multicolor image can be obtained. The receptor may be plastic, metal, ceramic, glass, etc. The process is useful for color proofing.

10 Claims, No Drawings

PROCESS FOR FORMING IMAGES BY PHOTOHARDENING AND APPLYING A COLORANT

BACKGROUND OF THE INVENTION

1. Field of the Invention

This invention relates to image reproduction systems that employ a photohardenable material, including photopolymerizable material, to modulate adherence of image readout material to the imaging layer.

2. Description of the Prior Art

The prior art describes both colored and uncolored photopolymer layer processes. Uncolored photopolymerizable layers are selectively colored by applying dry pigments to the imagewise exposed, clear photopolymerizable layer so that pigment adheres selectively to the underexposed areas. See Assignee's patents to M. Burg and A. B. Cohen, U.S. Pat. No. 3,060,024 and U.S. Pat. No. 3,060,025, and Assignee's Application of J. Celeste and V. Chu, U.S. Ser. No. 684,945, filed Nov. 22, 1967, now U.S. Pat. No. 3,607,264, issued Sept. 21, 1971. Precolored layers have been described which are imagewise exposed, contacted with a separate receptor using heat and pressure, and separated from the receptor to yield a transferred image on the receptor. See Assignee's patent to M. Burg and A. B. Cohen, U.S. Pat. No. 3,060,023 and Assignee's Application of V. Chu and A. B. Cohen, U.S. Ser. No. 705,323 filed Feb. 14, 1968, now abandoned, and first refiled as Ser. No. 775,123, Nov. 12, 1968. The latter case also describes a photopolymer image reproduction process wherein the image is developed by dissolving away underexposed areas with a selective solvent.

Phlipot, U.S. Pat. No. 3,236,647, describes a color reproduction process involving multiple coatings and pigment dustings of photohardenable dimers. Readout is facilitated by softening by heat or by solvent treatment.

The present method of producing multicolor images involves the successive lamination, exposure, and pigment dusting of photopolymer layers on a receptor. Since each layer is laminated onto another smooth layer, the problem of poor contact between the imaged layer and the receptor inherent in image transfer processes is eliminated. Back transfer, also associated with multiple transfer processes, is also eliminated, since there is perfect adhesion between each of the successive photopolymer layers.

In addition, the problem of registration and the accompanying image distortion which results from having the transfer step follow exposure is solved by the present method, wherein the photopolymer is exposed after the layer has been laminated onto the receptor.

SUMMARY OF THE INVENTION

This invention relates to a photopolymer image reproduction process employing a removable base support that transmits actinic radiation and a layer of a clear photopolymerizable material.

The process comprises: (a) laminating the photopolymerizable layer to a receptor, (b) exposing the said layer imagewise to actinic radiation through the support which selectively raises the stick temperature of those areas receiving radiation, (c) removing the base support and applying colorant material which adheres only to the underexposed areas of the layer to readout the image, and optionally (e) repeating the laminating, exposing, and readout steps in sequence to give a multicolor print.

A preferred embodiment of the present invention employs lamination of a layer of photopolymerizable material on a removable support that transmits actinic radiation to a suitable receptor, imagewise exposure of the layer through a specific color printer of a separation positive and said support, removal of the support from the coating, applying pigment or dye on the exposed surface of the layer, lamination of another photopolymerizable layer on a removable support onto the first layer, exposure through another color printer of the separation positive and said support and applying pigment or dye onto the resulting layer. This procedure is repeated until the desired multicolor image has been reproduced. After the final image readout, a clear photopolymerizable layer can be laminated onto the outer image-bearing layer, and the clear layer hardened by photopolymerization to form a protective layer.

The process of the invention may include post exposure of the last pigmented layer. Further variations on the post exposure step involve post exposing each individual layer after image readout or the lamination and post exposure of a clear photopolymerizable layer after each of the colored layers.

DESCRIPTION OF THE PREFERRED EMBODIMENTS

In general, the process of this invention comprises: (1) laminating a photohardenable element, comprising a photohardenable layer, onto a removable support that is transparent to actinic radiation to a receptor surface, (2) exposing said layer imagewise through said support to actinic radiation to selectively raise the stick temperature of those areas receiving the radiation, (3) removing said support, and (4) applying colorant material to the exposed layer which adheres only to the underexposed areas of the layer to reveal a colored image. Repeating the laminating, exposing, removing and readout steps in sequence results in a multicolor image.

The photohardenable element may also have a removable cover sheet on the photohardenable layer, which cover sheet is less strongly adherent at room temperature to the photohardenable layer than is the base support. In this instance, the cover sheet is removed from the photohardenable element prior to the lamination of the layer or the element to the receptor.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

Among suitable photopolymerizable or photohardenable systems are: (1) those in which a photopolymerizable monomer is present alone or in combination with a compatible binder, or (2) those in which the photopolymerizable group is attached to a polymer backbone which becomes activated on exposure to light and may then cross-link by reacting with a similar group or other reactive sites on adjacent polymer chains. In the second group of suitable photopolymerizable systems, where the monomer or pendant photopolymerizable group is capable of addition polymerization, e.g., a vinyl monomer, the photopolymerized chain length may involve addition of many similar units initiated by a single photochemical act. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a cross-linked network can be produced.

The term "underexposed" as used herein is intended to cover the image areas of the photopolymerizable layers which are completely unexposed or those exposed only to the extent that there is polymerizable compound still present in sufficient quantity that the molecular weight remains substantially lower than that of the complementary exposed image areas. The term "stick temperature" as applied to either an underexposed or exposed area of a photopolymerizable stratum means the minimum temperature at which the image area in question sticks or adheres, within 5 seconds, under slight pressure, e.g., thumb pressure, to analytical paper (Schleicher and Schull analytical filter paper No. 595) and remains adhered in a layer of at least detectable thickness after separation of the analytical paper from the stratum.

In a preferred photopolymer image reproduction element, the receptor is a material that adheres strongly to the polymer coating. Almost any material, e.g., paper, polymer film, plastic, metal, ceramic, glass, etc., makes a suitable receptor. The only prerequisites for a receptor are that the anchorage between the receptor and the coating be greater than that between the coating and the base, and that the receptor be stable at the operating temperatures. Polyethylene fulfills the roll of a suitable cover sheet since it shows a weaker adhesion to photopolymer than does polyethylene terephthalate, the preferred base support.

If either a simple monomer or monomer-polymer binder is being used, the element in the preferred process contains a free radical generating, addition polymerization initiator in the photopolymerizable layer. In addition, particularly when a photocrosslinkable polymer or dimer system is used, the layer may also contain a plasticizing agent.

Suitable free radical initiated, chain propagating, addition polymerizable, ethylenically unsaturated compounds for use in the simple monomer or monomer-polymer binder photopolymerizable layers are described in Burg et al. U.S. Pat. No. 3,060,023; Celeste et al. U.S. Pat. No. 3,261,686; and in Assignee's Cohen and Schoenthaler U.S. Pat. No. 3,380,831, Apr. 30, 1968. Polymers for use in the monomer-polymer binder system and preferred free radical generating addition polymerization initiators are described in U.S. Pat. No. 3,060,023.

Photodimerizable materials useful in the invention are cinnamic acid esters of high-molecular weight polyols, polymers having chalcone and benzophenone type groups, and others disclosed in Chapter 4 of "Light-Sensitive Systems" by Jaromir Kosar published by John Wiley & Sons, Inc., New York, 1965. Photopolymerizable materials capable of photocrosslinking with more than one adjacent polymeric chain to form a network are described in Assignee's U.S. application Ser. No. 759,217 by Jack R. Celeste, filed Sept. 11, 1968, and A. C. Schoenthaler, U.S. Pat. No. 3,418,295, Dec. 24, 1968.

Preferred free radical generating addition polymerization initiators, activatable by actinic radiation, e.g., ultraviolet and visible radiation, are listed in U.S. Pat. No. 3,060,023 and the other patents referred to above.

Where the polymer is a hard, high-melting compound a plasticizer is usually used to lower the glass transition temperature and facilitate selective stripping. The plasticizer may be a monomer itself, e.g., a diacrylate ester, or any of the common plasticizers which are compatible with the polymeric binder. Among the common plasticizers are dialkyl phthalates, polyethylene glycol, and alkyl phosphates.

The base support material may have low-oxygen permeability and should be thermally stable in the range of operating temperatures.

The photohardenable layer thickness can vary according to the stratum composition and the material used as receptor. The number of layers of photopolymer in the element is dependent upon the image being reproduced, the desired quality of the final product, and the uses made of the final product.

The various pigments which may be used in the present invention are applied by a dusting treatment similar to that disclosed in U.S. Pat. No. 3,060,024, or by transfer as in U.S. Pat. No. 3,060,025. Pigment dusting may be carried out at room temperature, or at an elevated temperature if the pigment does not adhere well to the unexposed areas. After the excess pigment is dusted off, the particles will remain only in the underexposed areas.

Additionally, other materials besides colorants can be applied to the image-bearing layers, e.g., magnetic materials, electrical or heat conducting materials, hydrophilic or hydrophobic materials. Dyes may be used as colorants.

When the process of this invention is used to prepare nameplates, disperse dyes are applied to the photopolymerizable layers. These dyes must be soluble in the unpolymerized matrix and insoluble in the polymerized areas.

The exposure of the photopolymerizable element may be through line or halftone positive transparencies. The transparency and the element may or may not be in operative contact, and although exposure may be made through either side in the case of an element that has both support and receptor of a transparent material, in a preferred method the element is exposed through the support side.

Since most of the photohardenable materials preferred in this invention generally exhibit their maximum sensitivity in the ultraviolet range, the light source should furnish an effective amount of this radiation. Such sources include carbon arcs, mercury-vapor arcs, fluorescent lamps with special ultraviolet-emitting phosphors, argon glow lamps, electronic flash units and photographic flood lamps. Other light sources are satisfactory when material sensitive to visible light is used. The amount of exposure required for satisfactory reproduction of a given element is a function of exposure time, type of light source used, and distance between light source and element.

The invention will be further illustrated by, but is not intended to be limited to, the following detailed examples of various embodiments.

EXAMPLE I

The following solution was prepared:

| Solution A | Grams |
|---|---|
| Triethylene glycol dimethacrylate | 125 |
| Methyl methacrylate polymer (low mol. wgt.) (density=1.13 g./cc.) | 107 |
| 2-o-Chlorophenyl-4,5-bis-imidazolyl dimer-(m-methoxyphenyl) | 6 6 |
| 2-Mercaptobenzothiazole | 6 |
| 7-Diethylamino-4-methylcoumarin | 3 |
| Trichloroethylene | 1.770 |

Solution A was stirred for approximately 15 minutes at room temperature with a magnetic stirrer. The solution was coated onto a 0.001 inch-thick film base of polyethylene terephthalate at a coating speed of 6 ft./min.

The coating was allowed to dry at 55° C. A 0.001 inch-thick cover sheet of polyethylene was laminated onto the coating at room temperature, at a pressure of 22 lbs. (translatable into nip force by known mathematical methods).

Blue Printer Positive

The cover sheet was stripped at room temperature from the coating, and the photopolymerizable layer was laminated at 80° C. onto the smooth side of Kromekote cast-coated one-side cover paper, manufactured by The Champion Paper and Fiber Company, on a fixed-bed transfer machine (as described in Assignee's Chu et al. application Ser. No. 700,117, filed Jan. 24, 1968, now U.S. Pat. No. 3,594,535, issued July 20, 1971). The photopolymer was exposed through a blue printer separation halftone positive for 2-½ sec. using a nuArc "Flip Top" Plate Maker, Model FT 26M-2 carbon arc light source. The polyethylene terephthalate film base was removed at room temperature, and Primrose Yellow toner (C.I. Pigment Yellow 34) was applied to the photopolymer surface. Excess toner was removed with a cotton pad. The pigment adhered only to those areas that were not exposed to light.

Green Printer Positive

The polyethylene cover sheet was removed from a second element coated with solution A, and the clear photopolymer was laminated onto the blue printer photopolymerizable layer, obtained above, at a temperature of 80° C. The two-layer film base was exposed through a green printer separation halftone positive for 3 seconds using the nuArc light source. The base support was stripped from the photopolymer, and a magenta toner, a dispersion consisting of 50 percent quinacridone magenta (C.I. Pigment Red 122) and 50 percent cellulose acetate, was applied to the exposed surface at room temperature. The excess toner was dusted off with a cotton pad, the pigment adhering to the underexposed areas only.

Red Printer Positive

After removal of the polyethylene cover sheet from a third photopolymerizable layer, the latter layer was laminated onto the green printer photopolymerizable layer. This was exposed through the red printer halftone positive for 3 seconds using the nuArc light source. The polyethylene terephthalate was removed from the red printer layer, and a phthalocyanine blue toner, a dispersion of 50 percent phthalocyanine blue (C.I. Pigment Blue 15) and 50 percent cellulose acetate was dusted onto the exposed surface at room temperature. The excess toner was removed with a cotton pad, leaving pigment in the underexposed areas only.

Black Printer Positive

A fourth photopolymerizable layer was laminated onto the red printer layer of the three-layer film base using the same procedure and under the same experimental conditions used in preparing the two previous layers. The fourth layer was exposed through a black printer halftone positive for 3 seconds using the nuArc light source. After stripping off the polyethylene terephthalate, a carbon black toner (C.I. Pigment Black 7) predispersed in pentaerythritol resin was applied to the exposed surface at room temperature. The excess pigment was dusted off with a cotton pad, leaving pigment in the underexposed areas only.

A good quality, four-color halftone positive was obtained, exhibiting slight three-dimensional effects.

EXAMPLE II

The following solutions and coatings were prepared:

| Solution B | Grams |
|---|---|
| Triethylene glycol dimethacrylate | 62.5 |
| Methyl methacrylate polymer (low mol. wgt.) (density=1.13 g./cc.) | 53.5 |
| 2-o-Chlorophenyl - 4,5-bis-(m-methoxyphenyl) imidazolyl dimer | 3.0 |
| 2-Mercaptobenzothiazole | 3.0 |
| 7-Diethylamino-4-methylcoumarin | 1.5 |
| Trichloroethylene | 885.0 |
| **Solution C** | |
| Solution B | 400 g. |
| Trichloroethylene | 200 g. |

Coating A

Solution C was stirred for about 15 minutes at room temperature with a magnetic stirrer. The solution was coated onto a 0.001 inch-thick film base of polyethylene terephthalate at a coating speed of 6 ft./min.

The coating was dried at 55° C., and a 0.001 inch-thick cover sheet of polyethylene was laminated onto the coating at room temperature at a pressure of 22 lbs.

Coating B

Same solution and procedure used in preparation of coating A, except coating speed was 12 ft./min.

After delamination of the polyethylene cover sheet, the various photopolymerizable layers are laminated onto the smooth surface of a receptor in the same sequence and using the same procedures used in Example I. The experimental conditions and materials are presented in the table below.

receptor - Kromekote cast coated one side cover paper, manufactured by The Champion Paper and Fiber Company positive - halftone transparency

| Layer | Coating | Lamination | Exposure | Toner |
|---|---|---|---|---|
| Blue printer | Coating B | Flat-bed transfer machine, 80° C. | ν/Arc®, 3 sec. | 50% flavanthrone yellow (C.I. Vat Yellow 1), 50% cellulose acetate dispersion. |
| Green printer | do | do | do | 50% quinacridone magenta (C.I. Pigment Red 122), 50% cellulose acetate dispersion, 8 parts by vol. and 50% phthalocyanine blue (C.I. Pigment Blue 15), 50% cellulose acetate dispersion, 1 part by vol. |
| Red printer | Coating A | do | do | Cellulose acetate dispersion of C.I. Pigment Blue 15. |

The yellow area of the print appeared greenish as a result of monomer migration.

EXAMPLE III

The following solution was prepared:

| Solution D | Grams |
|---|---|
| Methyl methacrylate polymer (low mol. wgt.) (density=1.13 g./cc.) | 5,000 |
| Isopropyl alcohol | 100 |
| Trimethylolpropanetrimethacrylate (av. mol. wt. about 1,000) | 6,410 |
| Polyoxyethylene | 500 |
| 2-o-Chlorophenyl-4,5-bis-(m-methoxyphenyl) imidazolyl dimer | 199 |
| 7-Diethylamino-4-methylcoumarin | 30.4 |
| 2-Mercaptobenzothiazole | 30.4 |
| Trichloroethylene | 50,000 |

Coating C

Solution D was stirred for about 15 minutes. The solution was coated on a 0.004 inch-thick polyethylene terephthalate base support which was resin-coated (F. P. Alles, U.S. Pat. No. 2,779,684. Example IV), at room temperature and at a coating speed of 11 ft./minute.

The coating was allowed to dry at 55° C. A 0.001 inch-thick cover sheet of polyethylene terephthalate was laminated onto the coating at room temperature at a pressure of 20 lbs.

Using the same sequence of steps for each successive layer, a four-color print was prepared on paper using the procedures of Example I. Experimental conditions and materials are given in the table below.

The coated polyethylene terephthalate support showed greater adhesion to the photopolymerizable layer than did the uncoated polyethylene terephthalate cover sheet. However, the coated support adhered less strongly to the layer than did the paper receptor.

receptor - Kromekote cast coated one-side cover paper positive - halftone transparency

| Layer | Coating | Lamination | Exposure | Toner |
|---|---|---|---|---|
| Blue printer | Solution D | Flat-bed transfer machine, 85° C. | ν Arc®, 3½ sec. | 50% C.I. Vat Yellow 1, 50% cellulose acetate dispersion. |
| Green printer | do | do | ν Arc®, 5 sec. | 50% C.I. Pigment Red 122, 50% cellulose acetate dispersion, 8 parts by vol. and 50% cellulose acetate dispersion, 1 part by vol. |
| Red printer | do | do | do | C.I. Pigment Blue, cellulose acetate dispersion. |
| Black printer | do | do | ν Arc®, 4 sec. | Monomer*-treated Jungle Black (C.I. Pigment Black 1). |

*Polyoxyethyltrimethylolpropane triacrylate having an average molecular weight of about 1,000. (Preparation described in Cohen-Schoenthaler U.S.P. 3,380,831.) A slurry of Jungle Black and the triacrylate in acetone was evaporated on the surface leaving a pigment of low stain.

After application of the black toner to the photopolymerizable layer, a fifth layer of photopolymer was laminated onto the receptor at 85° C. With the support attached, the print was post exposed for 30 sec. using the nuArc light source. The support was removed at room temperature.

A very sharp four-color print was obtained.

EXAMPLE IV

Using the sequence of steps and procedures of Example I, a five-layer multicolor print was prepared on a rough-surface paper. The experimental conditions and materials are given in the table below.

A clear photopolymerizable sublayer is first laminated to the paper receptor to provide a smooth surface upon which the successive pigmented layers could be laminated.

receptor - "Hallmark" Vellum paper - manufactured by Hallmark Cards, Inc.

positive - halftone transparency

EXAMPLE VII

The following solution was prepared:

| Solution E | |
|---|---|
| Trichloroethylene | 400.0 g. |
| Methyl methacrylate polymer (low mol. wt. density=1.13 g./cc.) | 100.0 g. |
| Polyoxyethyltrimethylolpropane triacrylate (avg. mol. wt.—1,000) | 130.0 g. |
| 2-o-Chlorophenyl-4,5-bis-(m-methoxyphenyl) imidazolyl dimer | 6.0 g. |
| Tinopal PCR (whitener mfg. by Geigy Chemical Corp.) | 0.5 g. |
| 2-Mercaptobenzothiazole | 0.6 g. |
| Trichloroethylene | to 1,000.0 g. |

| Layer | Coating | Lamination | Exposure | Toner |
|---|---|---|---|---|
| Under coating | Solution D | Flat-bed transfer machine, 85° C. | ν/Arc®, 3 sec | |
| Blue printer | do | do | ν/Arc®, 3½ sec | 50% C.I. Vat Yellow 1–50% cellulose acetate dispersion. |
| Green printer | do | do | ν/Arc®, 5 sec | 50% C.I. Pigment Red 133–50% cellulose acetate dispersion–8 parts by volume, and 50% C.I. Pigment Blue 15–50% cellulose acetate dispersion–1 part by by volume. |
| Red printer | do | do | do | C.I. Pigment Blue 15–cellulose acetate dispersion. |
| Clear | do | do | ν/Arc®, 2½ min | |

The fifth layer served as protection for the final product and allowed the print to be post polymerized.

EXAMPLE V

A four-color print was prepared on a matte surface using the steps and procedure of Example I. Experimental conditions and materials are given in the table below.

receptor — Kromekote cast coated one-side cover paper positive — halftone transparency Solution E was coated on a 0.001-inch-thick polyethylene terephthalate base support at room temperature, at a coating speed of 12 feet per minute and was allowed to dry at 55° C.

The clear photopolymerizable layer was then laminated at room temperature onto a sheet of anodized aluminum, which was then exposed for 30 seconds through a positive transparency using the Nu Arc light source.

The polyethylene terephthalate support was removed from the photopolymer layer and a blue toner (C.I. Dispersion Blue 59) was applied to the photopolymerizable layer, the dye ad-

| Layer | Coating | Lamination | Exposure | Toner |
|---|---|---|---|---|
| Blue printer | Solution D | Flat-bed transfer machine, 85° C. | ν/Arc®, 3½ sec | 50% C.I. Vat Yellow 1–50% cellulose acetate dispersion. |
| Green printer | do | do | ν/Arc®, 5 sec | 50% C.I. Pigment Red 122–50% cellulose acetate dispersion–8 parts by volume, and 50% C.I. Pigment Blue 15–50% cellulose acetate dispersion–1 part by volume. |
| Red printer | do | do | do | C.I. Pigment Blue 15–cellulose acetate dispersion. |
| Black printer | do | do | ν/Arc®, 4 sec | Monomer-treated Jungle Black (C.I. Pigment Black 1) of Example III. |

A fifth photopolymerizable layer was laminated to the paper receptor. The polyethylene terephthalate support was removed from the print, and a sheet of drafting film (translucent film consisting of a matte surface coating on a clear polyethylene terephthalate support), with the matte surface facing the said fifth layer, was laminated onto the photopolymer layers at a temperature of 85° C. The print was post exposed using a nuArc light source, and the drafting film was removed at room temperature.

A matte surface four-color print was obtained.

EXAMPLE VI

A four-color print was prepared using the same sequence of steps and procedures used in Example I. Experimental condihering to the unexposed areas only.

The following procedures were then used to prepare aluminum nameplates from three samples of the above photopolymer plates:

a. The toned, photopolymerized aluminum coated plate was heated 10 minutes in an oven at 200° C. to give a high quality, anodized aluminum nameplate.

b. The second toned, photopolymerized plate was heated for 4 minutes in an oven at 170° C. and then washed with ethanol to remove the photopolymer in the unexposed areas. The nameplate was then heated for 10 minutes in boiling water.

c. After heating for 10 minutes in an oven at 170° C., the third toned, photopolymerized plate was washed with methylene chloride, which removed all the photopolymerized layer from the aluminum support. A blue image of the unexposed areas of the original layer appeared on the plate, in-

| Layer | Coating | Lamination | Exposure | Toner |
|---|---|---|---|---|
| Blue printer | Solution D | Flat-bed transfer machine, 85° C. | ν/Arc®, 5 sec | Benzidine Yellow (C.I. Pigment Yellow 14). |
| Green printer | do | do | ν/Arc®, 6 sec | Pigment Scarlet (C.I. Pigment Red 60). |
| Red printer | do | do | do | Heliogen Blue (C.I. Pigment Blue 15). |
| Black printer | do | do | do | Monomer-treated Jungle Black (C.I. Pigment Black 1) of Example III. |
| Clear | do | do | ν/Arc®, 1 min | |

tions and materials are given below.

receptor — Kromekote cast coated one-side cover paper positive — combination halftone and line transparency The four-color print sharply defined the line and halftone areas of the original positive.

dicating that the dye had diffused into the pores of the anodized aluminum. The nameplate was heated for 10 minutes in boiling water.

EXAMPLE VIII

A four-color print was prepared using the experimental procedures of Example I. Between each pair of pigmented layers, two layers of clear photopolymer were laminated to increase the distance between the imaged layers and thereby enhance any three-dimensional effects.

receptor — Kromekote cast coated one-side cover paper
positive — halftone transparency

| Layer | Coating | Lamination | Exposure | Toner |
|---|---|---|---|---|
| Blue printer | Solution D | Flat-bed transfer machine, 70° C. | ν Arc®, 5 sec | Saturn Yellow (powdered thermoplastic melaminesulfonamideformaldehyde resin fluorescent dye) (particle size 3.5–4μ). |
| Clear | do | do | do | |
| Do | do | do | do | |
| Green printer | do | do | do | Pigment Scarlet (C.I. Pigment Red 60). |
| Clear | do | do | do | |
| Do | do | do | do | |
| Red printer | do | do | do | Heliogen Blue (C.I. Pigment Blue 15). |
| Clear | do | do | do | |
| Do | do | do | do | |
| Black printer | do | do | do | Monomer-treated Jungle Black (C.I. Pigment Black 1) of Example III. |

After the black pigment was dusted on, it was observed that the print was deficient in magenta. The magenta density was increased by laminating a second magenta layer onto the receptor, using the same procedure and toner used in preparing the first magenta layer.

A final layer of clear photopolymer was laminated onto the receptor, and the print was post exposed for 30 seconds using the nuArc light source.

A very sharp print was obtained, which conveyed some three-dimensional effect.

EXAMPLE IX

A two-color print was prepared on a copper plate using the procedures of Example I. Experimental conditions and materials are given below.

receptor — copper plate
film — line transparency

| Layer | Coating | Lamination | Exposure | Toner |
|---|---|---|---|---|
| Blue printer | Solution D | Flat-bed transfer machine, 40° C. | ν Arc®, 7 sec | 50% C.I. Vat Yellow 1–50% cellulose acetate dispersion. |
| Black printer | do | do | do | Monomer-treated Jungle Black (C.I. Pigment Black 1) of Example III. |
| Clear | do | do | ν Arc®, 10 sec | |

A sharp two-color photopolymer image on a copper plate is obtained.

EXAMPLE X

A high opacity, multilayer print was prepared using the procedures of Example I. Experimental conditions and materials are given below.

receptor — "PMS" (Pantone Matching System) reflex green paper, manufactured by Pantone, Incorporated.
positive — line-halftone transparency

| Layer | Coating | Lamination | Exposure | Toner |
|---|---|---|---|---|
| White | Solution D | Flat-bed transfer machine, 75° C. | ν/Arc®, 5 sec | $TiO_2$ dispersed in polyvinyl chloride binder. |
| Do | do | do | do | Do. |

The white pigment was applied at room temperature. Ten minutes after the second layer had been dusted, the white pigment was reapplied at 70° C.

A third photopolymerizable layer was laminated onto the receptor at room temperature, and after the polyethylene terephthalate support was removed, drafting film (matte surface facing the aforesaid third layer) was laminated onto the said third layer at 75° C. The film was post exposed for 15 sec. using a nuArc light source, and the drafting film was stripped away.

A sharp, very opaque image was obtained on the colored paper.

EXAMPLE XI

A multicolor decalcomania was prepared using the steps and procedures of Example I. Experimental conditions and materials are given below.

receptor — "Ceramicol Thermoflax" decal paper, manufactured by Brittains Inc.
positive — line transparency

| Layer | Coating | Lamination | Exposure | Toner |
|---|---|---|---|---|
| Blue printer | Solution D | Flat bed transfer machine, 65° C. | ν/Arc®, 17 sec | 50% C.I. Vat Yellow 1–50% cellulose acetate dispersion. |
| Red printer | do | do | ν/Arc®, 8 sec | Walchung™ Red Y (C.I. Pigment Red 48). |
| Clear | do | do | ν/Arc®, 30 sec | |

A good sample of photopolymer print on "decal" was obtained. The print may be easily transferred to glass, ceramic, or any of a number of suitable surfaces.

EXAMPLE XII

The following solution was prepared.

| Solution F | | |
|---|---|---|
| Polyethylene glycol (mol. wgt. 4,000) | | 1.80 g. |
| Methanol | | 6.60 g. |
| Methylene chloride | | 60 ml. |
| Cellulose acetate butyrate | (density=1.20 g./cc.) | 8.0 g. |
| Pentaerythritol triacrylate | | 20.0 g. |
| 2-Ethylanthraquinone | | 2.0 g. |

The polyethylene glycol was dissolved in methanol at room temperature by stirring with a magnetic stirrer. After addition of the methylene chloride and cellulose acetate butyrate, the solution was stirred until all the solid material dissolved. The pentaerythritol triacrylate and 2 ethylanthraquinone was added and the total weight of the solution was brought to 120 g. by addition of methylene chloride. Solution F was stirred for 30 min. at room temperature with magnetic stirrer. Just before the solution was coated onto the film base, 10 more grams of pentaerythritol triacrylate were added.

| Solution G | |
|---|---|
| Solution F | 40 g. |
| Methylene chloride | 40 g. |

Solution G was coated on 0.004 inch-thick polyethylene terephthalate base support which was resin-coated (F. P. Alles, U.S. Pat. No. 2,779,684, Example IV) to insure good anchorage.

After drying the coating at room temperature, a 0.001 inch-thick cover sheet of polyethylene terephthalate was laminated onto the photopolymer at room temperature.

The cover sheet was stripped from the film base, and a four-color print was prepared using the steps and procedures of Example I. Experimental conditions and materials are given below.

receptor — "Colitho," direct image offset duplicating paper, manufactured by Colitho Division, Columbia Ribbon and Carbon Manufacturing Co., Inc.
positive — halftone transparency

| Layer | Coating | Lamination | Exposure | Toner |
|---|---|---|---|---|
| Blue printer | Solution G | Flat bed transfer machine, 135° C. | Sun Gun®, 15 sec. 12" from film. | Benzidine Yellow (C.I. Pigment Yellow 12). |
| Green printer | do | do | Sun Gun®, 20 sec. 12" | Rhodamine (C.I. Pigment Red 81). |
| Red printer | do | do | Sun Gun®, 25 sec. 12" | Monastral Blue (C.I. Pigment Blue 15). |
| Black printer | do | do | Sun Gun®, 20 sec. 12" | Jungle Black (C.I. Pigment Black 1). |

All exposures and post exposures were performed with a Sylvania, Model SG-60, 1000W Sun Gun. After each pigment dusting operation, the photopolymer was post exposed for 30 seconds.

A reproduction of a four-color halftone positive was obtained on a paper support.

In place of the monomer of Example III, there may be used any of the addition polymerizable branched-chain polyesters of an alpha methylene carboxylic acid of three to four carbon atoms described in U.S. Pat. No. 3,380,831. They may have molecular weights of 450 to 40,000. Suitable polyesters are polyoxyethyltrimethylolpropane triacrylate or trimethacrylate and polyoxyethylpentaerythritol tetraacrylate or tetramethacrylate (described in said patent).

The invention represents an improvement and a simplification over processes which require image development by solvent treatment to selectively remove polymeric material or by selectively transferring the underexposed areas to a receptor surface by thermal delamination. A further simplification results from the fact that pigment may be applied to the photopolymerizable image at room temperature.

The present method further improves on the prior art by allowing intimate contact between photopolymerizable layers, which results in very sharp image reproduction, and it also permits the use of a wide variety of materials as receptors. Having the layers in such close contact also eliminates the problems of back transfer which may occur in multiple thermal transfer steps. Adhesion between the receptor and the photopolymer layers and between the individual polymer layers is much greater than that between the support and the coating.

Inherent in the process is a correction procedure for poor color or image reproduction. If, at any stage in the buildup of layers, it is observed that a specific image readout is of poor quality, that color record of the separation positive may be repeated in a new layer laminated onto the support, which will increase the density of that particular readout.

An added advantage inherent in the present process is that the exposure of photopolymerizable layers through the various color records follows the lamination of the layers to the receptor. This eliminates the possibility of image distortion occurring during the lamination step. Prior art processes compound this distortion problem by having the lamination step occur at elevated temperatures.

Since each of the colored records that make up the final multicolor image is in a separate photopolymerizable layer, a slight three-dimensional effect is produced. This may be enhanced by introducing a number of clear layers between the pigmented layers, increasing the distance between the colored images, or by increasing the thickness of the layers.

The embodiments of the invention in which an exclusive property or privilege is claimed are defined as follows:

1. A process for forming an image by photohardening comprising
   1. laminating to a receptor surface an ethylenically unsaturated photohardenable element comprising a support that transmits actinic radiation and a photohardenable layer, so as to form a laminated structure having said photohardenable layer contiguous to said receptor surface, said receptor surface having greater adhesion to said photohardenable layer in both its hardened and unhardened states than does said support;
   2. exposing said layer imagewise through said support to actinic radiation to selectively raise the stick temperature of those areas receiving the radiation;
   3. removing said support without transfer thereto of either exposed or underexposed areas of the photohardenable layer; and
   4. applying to the surface of the layer colorant material which adheres only to the underexposed areas to produce a colored image, and repeating said steps of laminating, exposing, removing, and applying one or more times, each succeeding photohardenable element having its photohardenable layer contiguous to the exposed and colored surface of the last previously laminated photohardenable layer.

2. A process according to claim 1, wherein said photohardenable layer is a photopolymerizable layer containing at least one free radical initiated, chain propagating, addition polymerizable compound containing at least one terminal ethylenic group, and an addition polymerization initiator activatable by actinic radiation.

3. A process according to claim 2, wherein each of said photopolymerizable layers contains a compatible macromolecular organic polymer binder.

4. A process according to claim 2, wherein said polymerizable compound is a polyoxyethyltrimethylolpropane triacrylate or trimethacrylate of average molecular weight 450 - 40,000.

5. A process according to claim 2, wherein said polymerizable compound is a polyoxyethylpentaerythritol tetraacrylate or tetramethacrylate.

6. A process according to claim 1, wherein each exposed and colored photohardenable layer is nonimagewise exposed to thermal or actinic hardening prior to laminating the succeeding photohardenable layer.

7. A process according to claim 1, wherein at least one of said exposing steps comprises nonimagewise exposure to thermal or actinic hardening, and the step of applying colorant material is omitted with respect to the nonimagewise exposed photohardenable layer.

8. A process according to claim 7, wherein said nonimagewise exposed photohardenable layer is the final layer.

9. A process according to claim 1, the exposure and colorant materials for at least 2 of said layers corresponding to different color regions of the visible spectrum, including black, whereby a multicolor image is produced.

10. A process according to claim 1, wherein the last exposed and colored photohardenable layer is nonimagewise exposed to thermal or actinic hardening.

* * * * *